United States Patent
Kurihara et al.

(10) Patent No.: US 6,307,403 B1
(45) Date of Patent: Oct. 23, 2001

(54) DELAY TIME CONTROL CIRCUIT

(75) Inventors: Naoki Kurihara; Jun Iida, both of Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 09/461,391

(22) Filed: Dec. 15, 1999

(30) Foreign Application Priority Data

Dec. 17, 1998 (JP) ................................................. 10-359232

(51) Int. Cl.$^7$ ....................................................... H03K 5/13
(52) U.S. Cl. .......................... 326/105; 327/276; 327/277
(58) Field of Search ................................. 327/261, 276, 327/262, 272, 278, 281; 326/105, 106, 107, 108

(56) References Cited

U.S. PATENT DOCUMENTS

| | | | |
|---|---|---|---|
| 5,708,382 | * | 1/1998 | Park ....................................... 327/277 |
| 5,777,501 | * | 7/1998 | AbouSeido ............................ 327/274 |
| 6,130,567 | * | 10/2000 | Kobayashi ............................ 327/278 |

FOREIGN PATENT DOCUMENTS

404207215 * 7/1992 (JP) .

OTHER PUBLICATIONS

IBM Technical Disclosure Bulletin, vol. 30, No. 2, Jul. 1987, "Scheme for reducing clock skew in multiple–chip system design".*

* cited by examiner

*Primary Examiner*—Tuan T. Lam
(74) *Attorney, Agent, or Firm*—Mattingly, Stanger & Malur, P.C.

(57) ABSTRACT

A delay time control circuit comprises a delay circuit composed of $2^n$ series-connected unit delay circuits each including a pair of series-connected, first and second inverters, where n is an integer equal to or more than 2, buffer circuits each connected to an output of each of the first and second inverters of the unit delay circuits of the delay circuit, $2^{n-1}$ first connection lines each connecting between outputs of adjacent ones of the buffer circuits connected to the second inverters and $2^{n-2}$ second connection lines each connecting between adjacent ones of the first connection lines. In response to an input signal input to the first inverter of first one of the unit delay circuit, an output signal delayed with respect to the input signal is obtained through one of the first connection lines and one of the second connection lines.

2 Claims, 2 Drawing Sheets

< DELAY TIME CONTROL CIRCUIT >

< DELAY TIME CONTROL CIRCUIT >

FIG·2    PRIOR ART
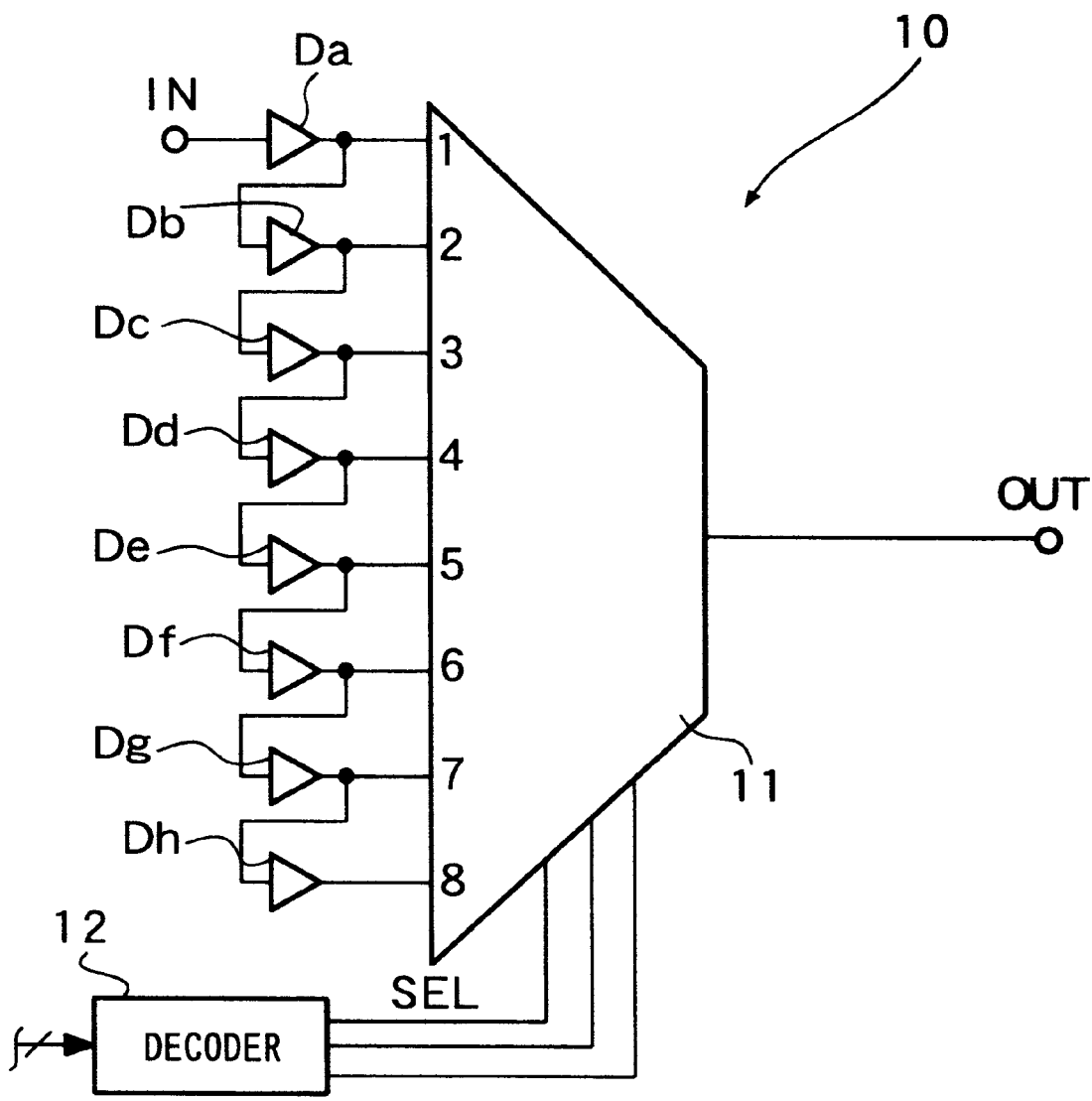
<DELAY TIME CONTROL CIRCUIT>

DELAY TIME CONTROL CIRCUIT

BACKGROUND OF THE INVENTION

1. Field of the Invention

The present invention relates to a delay time control circuit. Particularly, the present invention relates to a delay time control circuit capable of setting an amount of delay with high precision in a linear correspondence at both a leading edge and trailing edge of a pulse signal such as data and/or clock signal and, particularly, capable of setting an appropriate delay time for a write data in a CD-R/RW (CD-Recordable/Re-Writable) device.

2. Description of the Related Art

A data write speed of a recent CD-R/RW device has been increased remarkably.

The CD-R/RW device receives write data transferred from a host computer through an interface such as an SCSI (Small Computer System Interface) or an ATPI, EFM-modulates it and adds a modulated write data to a laser controller internally thereof. A laser light is on-off controlled for a write operation by the laser controller correspondingly to the EFM-controlled data and irradiates a predetermined track of a CD to form pits in the track to thereby write the data in the CD. The thus written data is read out by irradiating the track with a laser light controlled for read and receiving a light reflected from the pits by a light receiving element. The CD-R/RW device obtains the original data as a read-out data by demodulating the EFM-modulated signal received by the light receiving element and amplified by a read-out amplifier and transfers the read-out data to the host computer through the SCSI or ATPI.

In this case, in writing the EFM-modulated data in the CD, a length of a write time of the write data and a period of the data or the clock depends upon the write speed. Therefore, a timing regulation of the data or the clock becomes necessary. The timing regulation is performed by a delay circuit. In the case of the write operation of such as a CD-R/RW device, the timing regulation has to be performed with high precision. Furthermore, the timing regulation has to be performed by controlling the amount of delay at both a leading edge and a trailing edge of a pulse signal (1 bit) of such as the data or the clock signal with a preciseness corresponding to the write speed.

As shown in FIG. 2, a conventional delay time control circuit 10 for this purpose is constructed with a plurality of series-connected delay circuits Da to Dh, a selector 11 and a decoder 12. The delay circuits Da to Dh provide an appropriate amount of delay corresponding to the number of the delay circuits starting from the first delay circuit Da having an input used an input terminal IN of the delay time control circuit 10. The selector 11 receives outputs of the delay circuits Da to Dh, selects one of the outputs corresponding to a selection control signal SEL and outputs a signal having an aimed amount of delay with respect to the input signal at an output terminal OUT of the delay time control circuit 10. The selection control signal SEL is produced by decoding data sent from a controller, etc., by using the decoder 12. The selector 11 is constructed with AND gates and OR gates.

In the delay time control circuit 10 constructed with such AND gates and the OR gates, the gate operation when the signal input to the input terminal IN is HIGH level differs from that when the input signal is LOW level. Further, due to a difference between gate circuits, which operate in response to a selected output, it is impossible to select a total delay time in a linear relation. Therefore, a delay time in a leading edge of a pulse signal of one bit such as data or clock, etc., becomes different from that in a trailing edge thereof, causing a data error tend to occur.

SUMMARY OF THE INVENTION

An object of the present invention is to provide a delay time control circuit capable of precisely setting a delay amount in both a leading edge and a trailing edge of a pulse signal in a linear correspondency and of easily setting a timing required by a related device with respect to an input signal.

In order to achieve the above object, a delay time control circuit according to the present invention is featured by comprising a delay circuit composed of $2^n$ series-connected unit delay circuits each including a pair of series-connected, first and second inverters, where n is an integer equal to or more than 2, buffer circuits each connected to an output of each of the first and second inverters of the unit delay circuits of the delay circuit, $2^{n-1}$ first connection lines each connecting between outputs of adjacent ones of the buffer circuits connected to the second inverters and $2^{n-2}$ second connection lines each connecting between adjacent ones of the first connection lines, wherein, in response to an input signal input to the first inverter of first one of the unit delay circuits, an output signal delayed with respect to the input signal is obtained through one of the first connection lines and one of the second connection lines.

Assuming an inverter, to which a buffer amplifier is connected, an inverter preceding that inverter and a buffer circuit as a set of circuits, an output of the buffer circuit connected to the first connection lines and selected every other buffer circuit is produced by inverting an input signal to the preceding inverter twice, regardless of whether the input signal is "L" or "H". Therefore, the delay time measured from the input of the input signal to the output of the output signal is substantially not influenced by the state of the input signal. Further, an output of any one of the buffer circuits, which is selected every other buffer circuit, is produced through the second connection line, which is connected to the first connection lines connecting the one buffer circuit of the second inverter, to the adjacent buffer circuit of the second inverter. Therefore, a delay time of an output signal obtained through a second connection line is substantially the same as that obtained through any other second connection line, so that the selection of delay time can be determined substantially by the number of buffer circuits of the second inverters selected as providing outputs.

As a result, it is possible to highly precisely set an amount of delay with respect to an input pulse signal in a linear relation at both a leading edge and trailing edge of the pulse signal.

According to another aspect of the present invention, a delay time control circuit comprises a delay circuit composed of $2^n$ series-connected unit delay circuits each including a pair of series-connected, first and second inverters, where n is an integer equal to or more than 2, a three-state buffer circuit connected to an output of the second inverter of each unit delay circuit, connection lines for tournament-connecting the three-state buffer circuits of the unit delay circuits with using adjacent ones of the unit delay circuits as a unit and connecting an output of one of the three-state buffer circuits to an output terminal of the delay time control circuit and a buffer circuit connected to an output of the first inverter of each the unit delay circuit, the buffer circuit being equivalent to the three-state buffer circuit, wherein, in response to an input signal input to the first inverter of first one of the unit delay circuit, an output signal delayed by a predetermined amount with respect to the input signal is obtained through one of the tournament connection lines.

By constituting the delay circuit with a plurality of series-connected unit delay circuits each constituted with a pair of series-connected inverters and providing a circuit equivalent to a three-state buffer circuit in each unit delay circuit as a load, loads of the inverters of each unit delay circuit becomes equivalent. Therefore, an input of the unit delay circuit is inverted twice by these inverters. That is, when a signal "H" is input to the input terminal of the first inverter, it is inverted to "L" thereby and then inverted to "H" by the second inverter, which is output from the unit delay circuit. On the contrary, when a signal "L" is input to the input terminal of the first inverter, it is inverted to "H" thereby and then inverted to "L" by the second inverter, which is output from the unit delay circuit. Since the output signal is produced from the inverter of each unit delay circuit through the associated three-state buffer circuit in this manner, the delay time measured at the leading edge of a one-bit pulse signal such as data or clock, etc., becomes substantially the same as the delay time measured at the trailing edge of the one-bit pulse signal. Further, the three-state buffer circuits on the output side of the unit delay circuits are tournament-connected, the output is obtained through the same route by merely selecting one of the three-state buffer circuits and it is possible to set and control the whole delay time with the delay time (offset) of the path from the three-state buffer circuit to the output terminal as a fixed, constant delay time.

Since the offset of constant delay time in the path from the output terminal of the three-state buffer circuit to the output terminal of the delay time control circuit is substantially constant, it is possible to perform offset canceling in other circuits. Since the output of the delay time in each unit delay circuit is produced through the three-state buffer circuit associated therewith, it is possible to substantially neglect a difference in delay control time corresponding to the number of the unit delay circuits.

As a result, the selectively controlled delay time can be substantially determined by the delay time of the unit delay circuit and the number of the unit delay circuits, so that it is possible to highly precisely set an amount of delay at both a leading edge and a trailing edge of the input pulse signal in a linear relation with respect to the input pulse signal. Therefore, in, for example, a CD-R/RW, it is easily possible to realize a timing required at the operating speed thereof even when the operating speed of the CD-R/RW is made twice, four times and eight times, etc.

BRIEF DESCRIPTION OF THE DRAWINGS

FIG. 2 is a block circuit diagram showing a conventional delay time control circuit.

DETAILED DESCRIPTION OF THE PREFERRED EMBODIMENTS

Figure 1:
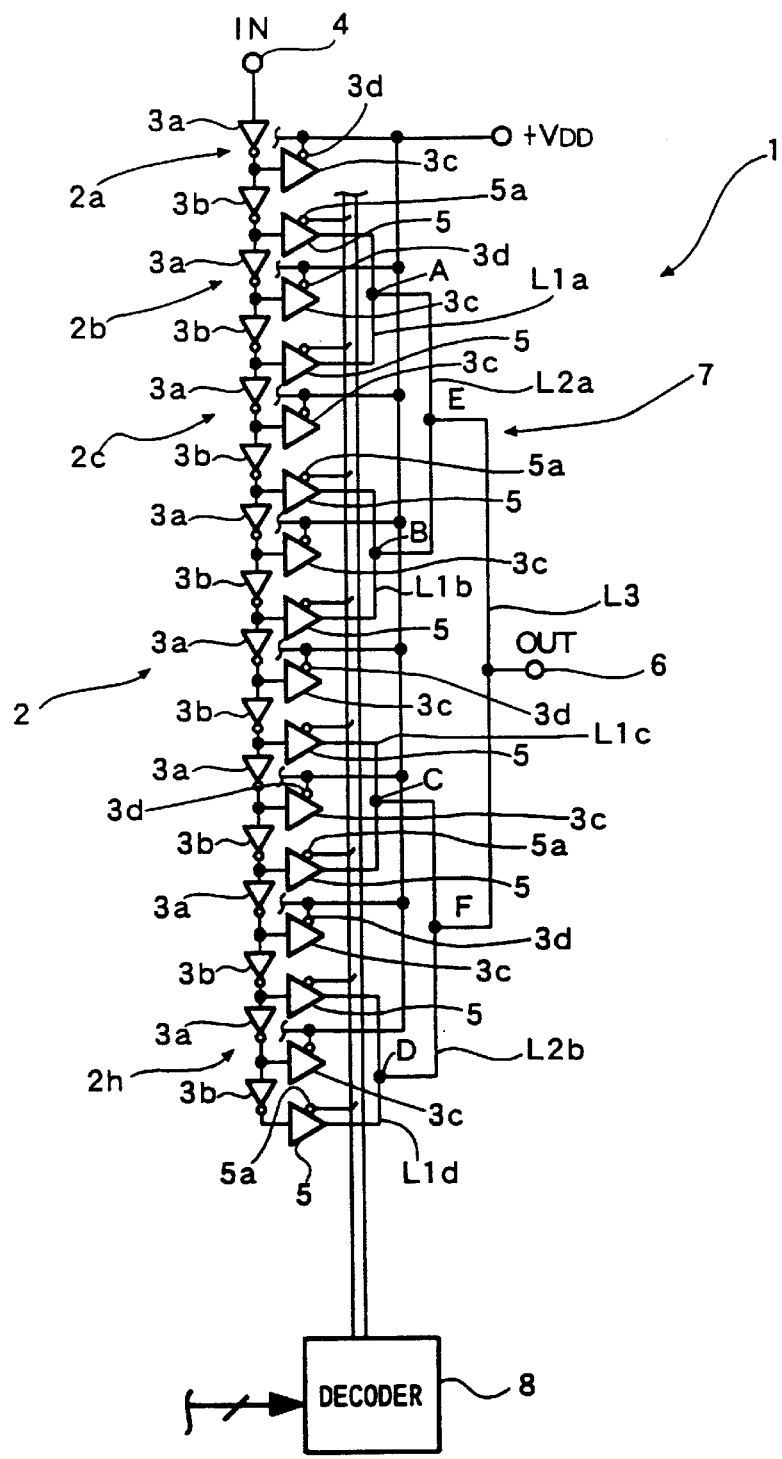
FIG. 1 is a block circuit diagram showing a delay time control circuit according to an embodiment of the present invention.

In FIG. 1, an embodiment of the delay time control circuit 1 according to the present invention is composed of a plurality of series-connected unit delay circuits 2a to 2h and a decoder 8. Each of the series-connected unit delay circuit 2a to 2h includes a pair of series-connected inverters 3a and 3b and has a certain delay time. In this embodiment, the number of the unit delay circuits, which is represented by $2^n$, is 8. That is, n is 3.

A plurality (8) of three-state buffer circuits 3c each having an input terminal, a control terminal 3d having a negative logic input and an output terminal are provided. The input terminal of each three-state buffer circuit 3c is connected to a junction between the inverters 3a and 3b of each unit delay circuit. A plurality (8) of three-state buffer circuits 5 each having an input terminal, a control terminal 5a input with a negative logic and an output terminal are provided. The input terminal of each three-state buffer circuit 5 is connected to an output of each unit delay circuit.

The first unit delay circuit 7 has an input terminal 4 (IN). The control terminals 3d of the three-state buffer circuits 3c are connected to a power source +VDD and the control terminals 5a of the three-state buffer circuits 5 are connected to the decoder 8.

The three-state buffer circuits 5 are tournament-connected through a tournament type connection line 7 including four first connection lines L1a, L1b, L1c and L1d, two second connection lines L2a and L2b and a third connection line L3. That is, the output terminals of the three-state buffer circuits 5 connected to the output terminals of the first and second unit delay circuits 2a and 2b are connected commonly to a point A of a first connection line L1a, the output terminals of the three-state buffer circuits 5 connected to the output terminals of the third and fourth unit delay circuits 2c and 2d are commonly connected to a point B of a first connection line L1b. The output terminals of the three-state buffer circuits 5 connected to the output terminals of the fifth and sixth unit delay circuits 2e and 2f are connected commonly to a point C of a first connection line L1c, the output terminals of the three-state buffer circuits 5 connected to the output terminals of the seventh and eighth unit delay circuits 2g and 2h are commonly connected to a point D of a first connection line L1d. The points A and B are commonly connected to a point E of a second connection line L2a and the points C and D are commonly connected to a point F of a second connection line L2b. The points E and F are connected commonly to an output terminal 6 through a third connection line L3.

Now, four first connection lines are equal to $2^2(=2^{3-1})$ and two second connection lines are equal to $2^1(=2^{3-2})$.

Each three-state buffer circuit 3c is a dummy load circuit equivalent to the three-state buffer circuit 5 and has the control terminal 3d(negative logic significant) connected to the power source line +VDD ("H"), as mentioned, to have an impedance set to high.

The control terminal 5a (negative logic significant) of one of three-state buffer circuit 5, which is selected by the decoder 8, is set "L" and an output thereof is selected and output at the output terminal 6 of the delay control circuit through selected one of the first connection lines L1a, L1b, L1c and L1d, selected one of the second connection lines L2a and L2b and the third connection line L3. The control terminals 5a of the other three-state buffer circuits 5 are made "H" to have high impedance.

Lengths of the tournament connection line 7 measured from the three-state buffer circuits 5 to the connection points A, B, C and D are substantially the same, lengths measured from the connection point E to the connection points A and B are substantially the same and lengths measure from the output terminal 6 to the connection points E and F are substantially the same. Further, by the use of the tournament connection line 7, it is possible to easily make the first, second and third connection lines substantially the same.

Therefore, regardless of the three-state buffer circuit selected by the decoder 8, the length of the connection line from the selected three-state buffer circuit to the output terminal 6 is always the same and a delay time measured from the input terminal 4 through a plurality (n) of unit delay circuits is determined by (a total delay time of the n unit delay circuits)+(operating delay time of one three-state buffer circuit 5)+(delay time due to the length of the connection line from the three-state buffer circuit 5 to the output terminal 6).

The time delay (operating delay time of one three-state buffer circuit 5) (delay time due to the length of the connection line from the three-state buffer circuit 5 to the output terminal 6) is substantially fixed. Assuming the time delay as a constant time td (offset time), the settable delay time TD becomes TD=n×t+td, where t is delay time of one unit delay circuit and n is the number of series-connected unit delay circuits counted from the input terminal to the selected three-state buffer circuit 5. Therefore, the delay time can be set stepwise correspondingly to the number of the series-connected unit delay circuits, so that highly precise setting of delay time becomes possible.

Since the delay time t of one unit delay circuit is usually much longer than the offset time td, the offset time td is negligible with respect to the delay time t. In a case where the offset time td is not negligible, however, it can be made negligible substantially by providing a delay circuit having a fixed delay time corresponding to the offset time td on the timing signal receiving side to regulate the timing of a main signal.

As mentioned previously, the inverters 3a and 3b constituting each unit delay circuit are connected to a three-state buffer circuit 3c and a three-state buffer circuit 5 as loads, respectively. Therefore, an input of the unit delay circuit is inverted twice by these inverters 3a and 3b. That is, when a signal "H" is input to the input terminal of the inverter 3a, it is inverted to "L" thereby and then inverted to "H" by the inverter 3b, which is output from the unit delay circuit. On the contrary, when a signal "L" is input to the input terminal of the inverter 3a, it is inverted to "H" thereby and then inverted to "L" by the inverter 3b, which is output from the unit delay circuit. Since the output signal is produced from the inverter 3b of each unit delay circuit through the associated three-state buffer circuit 5 in this manner, the delay time measured at the leading edge of a one-bit pulse signal such as data or clock, etc., becomes substantially the same as the delay time measured at the trailing edge of the one-bit pulse signal.

Incidentally, in this embodiment, the three-state buffer circuit 3c as the dummy load is set to high impedance. However, it is of course possible to set it in an operating state by connecting a suitable load thereto.

Particularly, in this embodiment, the three-state buffer circuits connected to the outputs of the respective unit delay circuits are connected to the output terminal 6 through the connection lines having substantially the same length and the output of any one of the unit delay circuits is provided at the output terminal 6 through one three-state buffer circuit. Therefore, it is possible to process the delay time of the path from the three-state buffer circuit to the output terminal as a fixed, constant delay time.

Further, in this embodiment, the lengths of the first, second and third connection lines are substantially the same, respectively. However, it is possible to obtain the effect of the present invention by merely making the lengths of the first connection lines substantially the same.

As a result, it becomes possible to make the delay time measured at the leading edge of a one-bit pulse signal such as data or clock, etc., substantially the same as the delay time measured at the trailing edge of the one-bit pulse signal. Therefore, it is possible, in, for example, a CD-R/RW, to set a suitable delay time by means of the decoder 8 even when the data write speed of the CD-R/RW is made twice, four times and eight times, etc., so that data error hardly occurs.

What is claimed is:

1. A delay time control circuit comprising:

a delay circuit composed of $2^n$ series-connected unit delay circuits each including a pair of series-connected, first and second inverters, where n is an integer equal to or more than 2;

a plurality of three-state buffer circuits each connected to a respective output of said second inverter of said unit delay circuit;

connection lines for tournament-connecting said three-state buffer circuits of said unit delay circuits with using adjacent ones of said unit delay circuits as a unit and connecting an output of one of said three-state buffer circuits to an output terminal of said delay time control circuit; and a plurality of buffer circuits each connected to a respective output of said first inverter of said unit delay circuit, said buffer circuit being equivalent to said three-state buffer circuit, wherein, in response to an input signal input to said first inverter of first one of said unit delay circuits, an output signal delayed with respect to said input signal is obtained through one of said tournament connection lines.

2. A delay time control circuit as claimed in claim 1, further comprising a decoder, wherein lengths of respective stages of said connection line are substantially the same, said buffer circuits are three-state buffer circuits set to high impedance and said decoder selects one of said three-state buffer circuits connected to said outputs of said unit delay circuits as providing an output signal by supplying a predetermined signal to a control terminal of said three-state buffer circuits connected to said outputs of said unit delay circuits and sets the remaining three-state buffer circuits to high impedance.

* * * * *